(12) United States Patent
Kajihara et al.

(10) Patent No.: US 8,536,936 B2
(45) Date of Patent: Sep. 17, 2013

(54) POWER SOURCE CONTROLLER AND SEMICONDUCTOR INTEGRATED CIRCUIT

(75) Inventors: Hirotsugu Kajihara, Yokohama (JP); Tetsuya Fujita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 13/231,632

(22) Filed: Sep. 13, 2011

(65) Prior Publication Data

US 2012/0229190 A1 Sep. 13, 2012

(30) Foreign Application Priority Data

Mar. 10, 2011 (JP) ................. 2011-053084

(51) Int. Cl.
*G05F 1/10* (2006.01)
(52) U.S. Cl.
USPC ............................................................. 327/544
(58) Field of Classification Search
USPC ........................................................ 327/544
See application file for complete search history.

(56) References Cited

U.S. PATENT DOCUMENTS

| | | | |
|---|---|---|---|
| 4,785,202 A * | 11/1988 | Toyoda | 326/101 |
| 6,584,596 B2 * | 6/2003 | Buffet et al. | 716/113 |
| 6,737,698 B1 | 5/2004 | Paul et al. | |
| 6,876,252 B2 * | 4/2005 | Kim et al. | 327/544 |
| 7,436,690 B2 * | 10/2008 | Chen | 365/104 |
| 7,486,108 B2 * | 2/2009 | Kim et al. | 326/34 |
| 7,511,528 B2 * | 3/2009 | Arsovski et al. | 326/27 |
| 2003/0067077 A1 * | 4/2003 | Lee | 257/758 |
| 2008/0083967 A1 * | 4/2008 | Nakatani et al. | 257/534 |
| 2009/0033155 A1 * | 2/2009 | Kanno et al. | 307/80 |
| 2009/0072888 A1 * | 3/2009 | Ogata | 327/534 |
| 2009/0322402 A1 * | 12/2009 | Mizuno et al. | 327/333 |
| 2010/0259316 A1 | 10/2010 | Fujita et al. | |
| 2012/0289011 A1 * | 11/2012 | Anezaki | 438/264 |
| 2012/0299636 A1 * | 11/2012 | Van Winkelhoff et al. | 327/434 |

FOREIGN PATENT DOCUMENTS

JP 2010-245403 10/2010

* cited by examiner

*Primary Examiner* — Thomas J Hiltunen
(74) *Attorney, Agent, or Firm* — White & Case LLP

(57) ABSTRACT

According to one embodiment, a power source controller has a first power source line supplied with a reference power source voltage, a second power source line connected to an internal circuit, a control circuit configured to control a connection between the first power source line and the second power source line, a control signal line connected to the control circuit, and configured to provide a control signal for controlling the connection, a transistor comprising a first terminal, a second terminal and a control terminal in the control circuit, the control terminal of the transistor being connected to the control signal line, a semiconductor substrate on which the transistor is formed, and first through third wires.

16 Claims, 5 Drawing Sheets

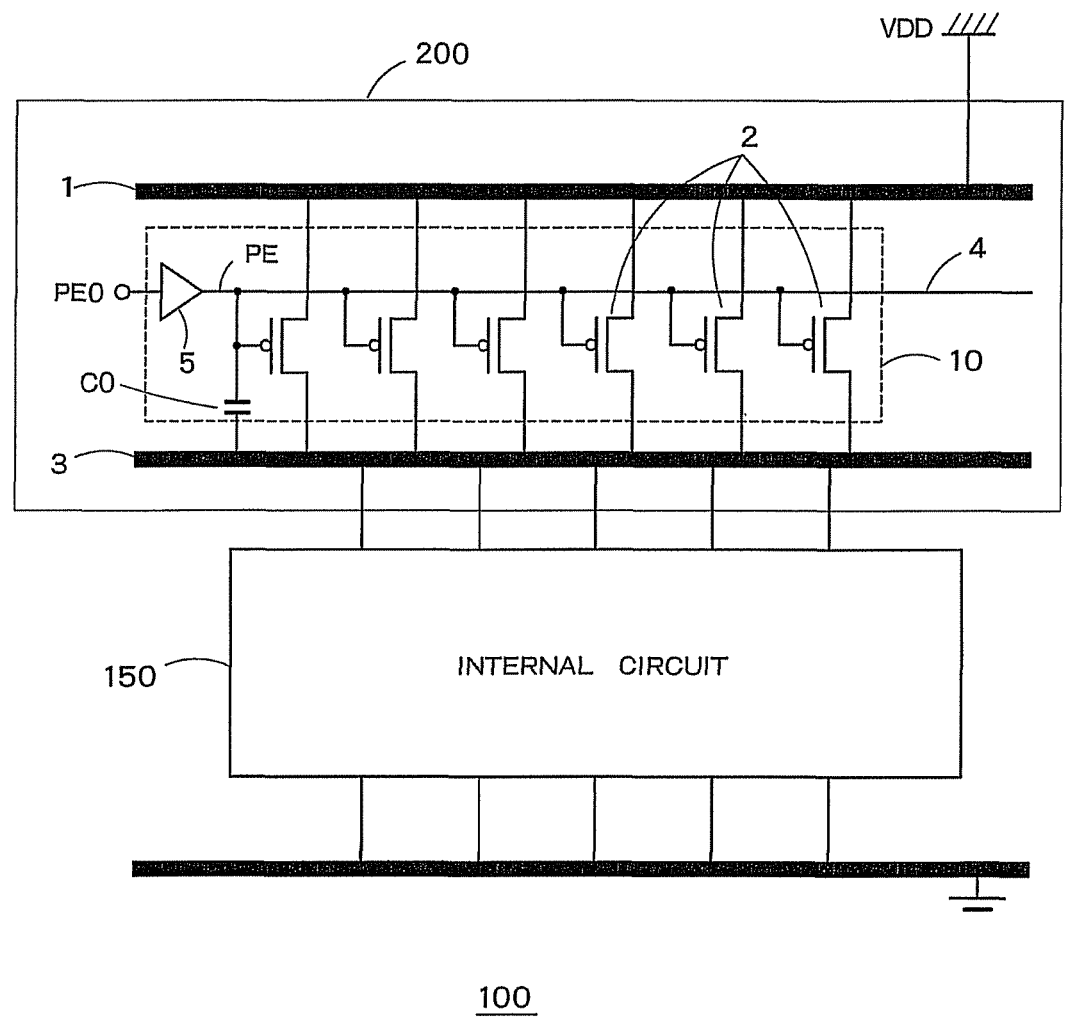
F I G. 1

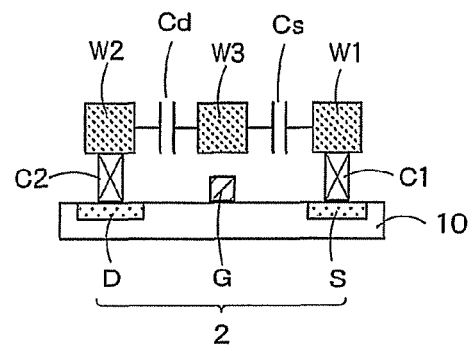
FIG. 3
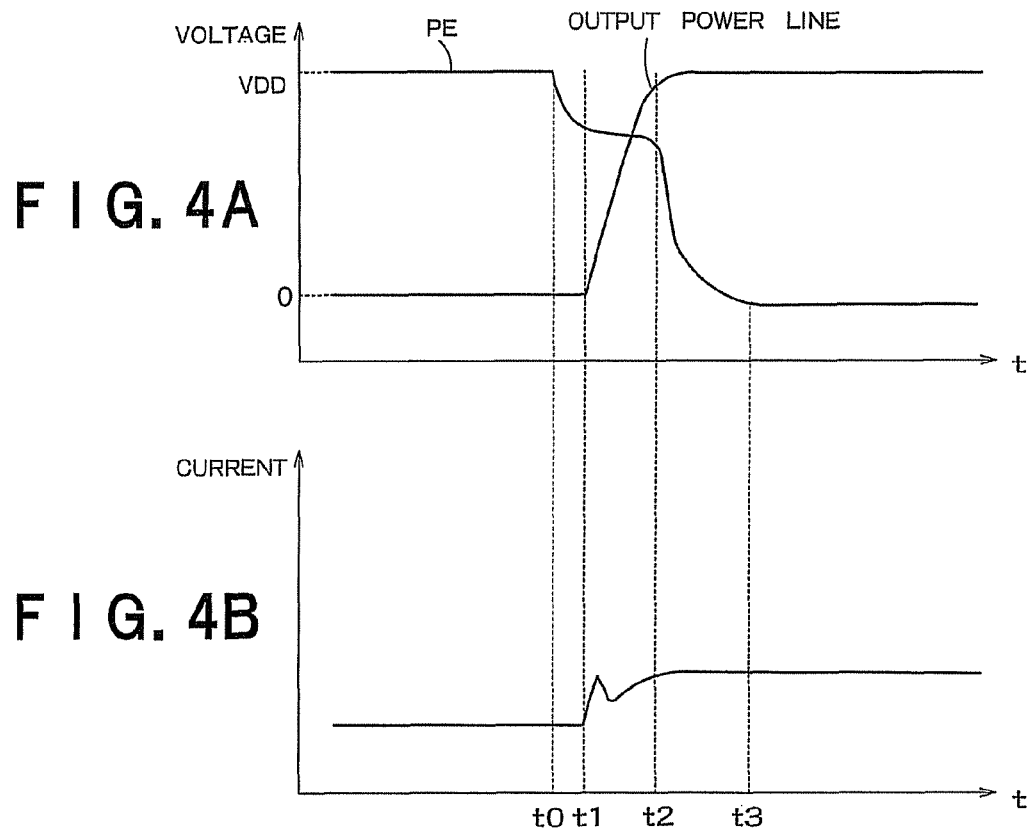
FIG. 4A
FIG. 4B

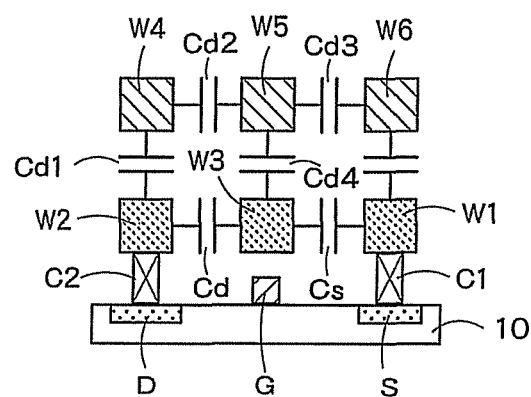
F I G. 6

US 8,536,936 B2

POWER SOURCE CONTROLLER AND SEMICONDUCTOR INTEGRATED CIRCUIT

CROSS REFERENCE TO RELATED APPLICATIONS

This application is based upon and claims the benefit of priority from the prior Japanese Patent Application No. 2011-53084, filed on Mar. 10, 2011, the entire contents of which are incorporated herein by reference.

FIELD

Embodiments described herein relate generally to a power source controller and a semiconductor integrated circuit.

BACKGROUND

Recently, semiconductor technologies have been advanced, and thus, semiconductor integrated circuits are becoming larger and have higher functions. On the other hand, it is strongly needed to reduce the consumption power at waiting with regard to portable devices and sensor network and so on. Even though multiple internal circuits are integrated in a semiconductor integrated circuit, all of the internal circuits do not always operate. Therefore, by stopping supplying the power source to the non-operating internal circuit, it is possible to reduce the consumption power.

However, there is a problem that a large inrush current may flow at changing a state where the power source is not supplied to the circuit to a state where the power source is supplied. Due to the inrush current, the supply voltage may vary, which can cause bad influence on the other internal circuit, or cause a gate break-down.

BRIEF DESCRIPTION OF THE DRAWINGS

FIG. 1 is a schematic block diagram of a semiconductor integrated circuit 100 having a power source controller 200 according to a first embodiment.

FIG. 3 is a cross-section of AA' portion of FIG. 2.

FIG. 4A is a voltage-waveform of each part of the power source controller 200.

FIG. 4B is a current-waveform of a current flowing in the output power source line 3 from the input power source line 1 through the transistors 2.

FIG. 6 is a cross-section of BB' portion of FIG. 5.

DETAILED DESCRIPTION

Figure 2:
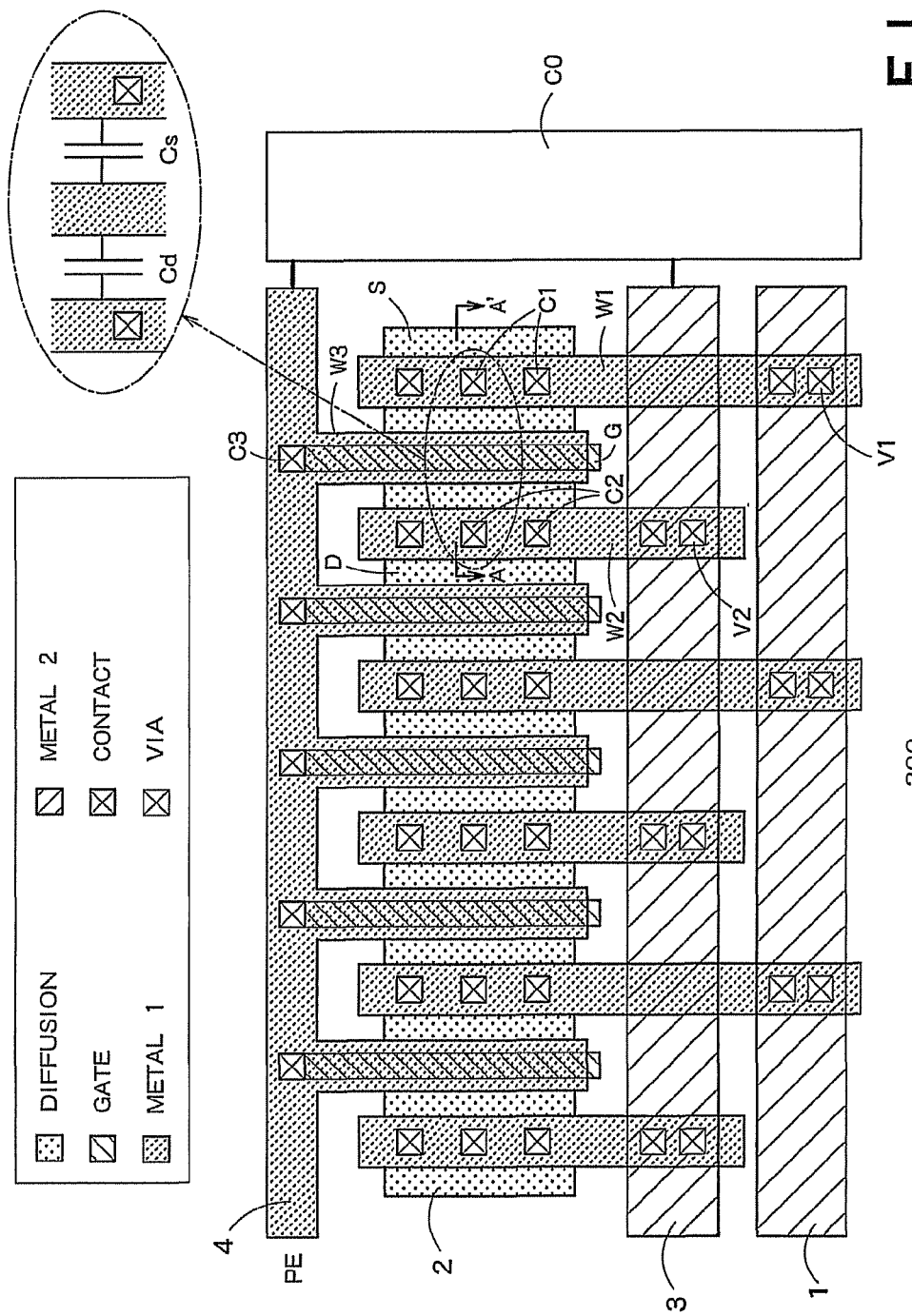
FIG. 2 is a diagram showing an example of a layout of the power source controller 200.

In general, according to one embodiment, a power source controller has a first power source line supplied with a reference power source voltage, a second power source line connected to an internal circuit, a control circuit configured to control a connection between the first power source line and the second power source line, a control signal line connected to the control circuit, and configured to provide a control signal for controlling the connection, a transistor comprising a first terminal, a second terminal and a control terminal in the control circuit, the control terminal of the transistor being connected to the control signal line, a semiconductor substrate on which the transistor is formed, a first wire on a wire layer above the semiconductor substrate, and configured to connect the first terminal of the transistor with the first power source line, a second wire on a wire layer above the semiconductor substrate, and configured to connect the second terminal of the transistor with the second power source line, and a third wire on a wire layer above the semiconductor substrate, above the control terminal of the transistor, and formed integrally with the control signal line.

Embodiments will now be explained with reference to the accompanying drawings.

First Embodiment

FIG. 1 is a schematic block diagram of a semiconductor integrated circuit 100 having a power source controller 200 according to a first embodiment. The semiconductor integrated circuit 100 has an internal circuit 150 and the power source controller 200. The power source controller 200 determines whether or not to supply the power source to the internal circuit 150 according to the control signal PE (Power Enable).

The power source controller 200 has an input power source line (first power source line) 1, one or multiple PMOS (P-type Metal Oxide Semiconductor) transistors 2, an output power source line (second power source line) 3, a control signal line 4, a buffer 5, a capacitor C0, and wires for connecting between each of the elements and the power source lines.

The input power source line 1 is supplied with a power source voltage VDD from a power source device (not shown) provided at the outside of the semiconductor integrated circuit 100. The source (first terminal), the gate (control terminal) and the drain (second terminal) of each of the transistors 2 are connected to the input power source line 1, the control signal line 4 and the output power source line 3, respectively. The output power source line 3 is connected to the power terminal of the internal circuit 150.

The transistors 2, the buffer 5 and the capacitor C0 form a control circuit 10, and control connection between the input power source line 1 and the output power source line 3. The control signal PE, which is provided from the control signal line 4, is inputted to the gate of the transistors 2. When the control signal PE is low, the transistor 2 turns on, and thus, the source and the drain of the transistors 2 are short-circuited. Accordingly, the power source voltage VDD is supplied to the output power source line 3 from the input power source line 1, and further, the power source voltage VDD is supplied to the internal circuit 150 from the output power source line 3. Then, the internal circuit 150 operates. On the other hand, when the control signal PE is high, the transistors 2 turn off, and thus, the source and the drain of the transistors 2 are separated. Accordingly, the power source voltage VDD is not supplied to the output power source line 3 from the input power source line 1. Then, the internal circuit 150 does not operate, thereby reducing the consumption power of the semiconductor integrated circuit 100.

The buffer 5 drives an input control signal PE0 to generate the control signal PE. The drive ability of the buffer 5 is designed so that the transistors 2 definitely are turned on even if some gate-leak current flows in the transistors 2 taking the number of the transistors 2 and a combined capacitor Ct (described below) into consideration. Furthermore, the capacitor C0 is connected between the control signal line 4 and the output power source line 3, and suppresses a large inrush current caused by a steep variation of the control signal PE.

FIG. 2 is a diagram showing an example of a layout of the power source controller 200. FIG. 3 is a cross-section of AA' portion of FIG. 2. Note that the buffer 5 is omitted in FIG. 2.

The transistors 2 having a gate G, a drain region D and a source region S are formed on a semiconductor substrate 10, for example, on a silicon substrate. The control signal line 4 is formed on a first wiring layer (METAL 1). The input power source line 1 and the output power source line 3 are formed on a second wiring layer (METAL 2) arranged above the first wiring layer. The power source controller 200 has first to third wires W1 to W3. The first wire W1 is formed on the first wiring layer, and connects the source region S of the transistors 2 with the input power source line 1 through the contact C1 and the via V1. The second wire W2 is formed on the first wiring layer, and connects the drain region D of the transistors 2 with the output power source line 3 through the via V2 and the contract C2. Furthermore, the gate G of the transistors 2 is connected to the control signal line 4 through the contact C3.

Moreover, the third wire W3 is formed above the gate G of the transistors 2, integrated with the control signal line 4 on the first wiring layer, which is one of the characteristic features of the present embodiment.

Between the semiconductor substrate 10 and the first wiring layer, and between the first wiring layer and the second wiring layer, an interlayer dielectric film (not shown) made of $SiO_2$ and so on is formed. Therefore, a capacitor Cd is formed between the third wire W3 and the second wire W2, and a capacitor Cs is formed between the third wire W3 and the first wire W1. Accordingly, between the control signal line 4 connected to the third wire W3 and the output power source line 3 connected to the second wire W2, the combined capacitor Ct=C0+Cd is formed. That is, the combined capacitor Ct larger than the capacitor C0 is formed.

Then, the operation of the power source controller 200 will be explained. FIG. 4A is a voltage-waveform of each part of the power source controller 200, and FIG. 4B is a current-waveform of a current flowing in the output power source line 3 from the input power source line 1 through the transistors 2.

Before time t0, the control signal PE is high, and thus, the power source voltage VDD is not supplied to the output power source line 3. Then, at time t0, it is assumed that the voltage of the control signal PE starts to decrease in order to begin supplying the power source voltage VDD to the internal circuit 150. At time t1, the voltage of the control signal PE becomes lower than the threshold voltage of the transistors 2, and thus, the transistors 2 gradually turn on. By such a manner, the current flows in the output power source line 3 from the input power source line 1. As a result, the voltage of the output power source line 3 increases.

The output power source line 3 is connected to one terminal of the combined capacitor Ct. Therefore, as the voltage of the output power source line 3 increases, the gradient of the decreasing voltage of the control signal PE, which is connected to the other terminal of the combined capacitor Ct, becomes gentle. Accordingly, the transistors 2 do not turn on immediately, but gradually turn on. Thus, as shown in FIG. 4B, a large inrush current does not flow around time t1.

When the voltage of the output power source line 3 gradually increases and reaches almost the power source voltage VDD around time t2, the voltage of the control signal PE decreases and reaches low at time t3. Because of this, the transistors 2 turn on completely, and the power source voltage VDD is stably supplied to the output power source line 3 from the input power source line 1. Then, the internal circuit 150 operates.

The variation of the control signal PE during time t0 to t1, t1 to t2, and t2 to t3 depends on the magnitude of the combined capacitor Ct. That is, as the combined capacitor Ct is larger, the variation of the control signal PE becomes gentler.

As a result, an inrush current at starting supplying the power source voltage VDD to the internal circuit 150 can be suppressed.

In the present embodiment, since the capacitor Cd is formed between the third wire W3 and the second wire W2 on the first wiring layer on which the second and the third wires W2 and W3 are also formed, even if the capacitor C0 is small, the combined capacitor Ct can be set large. Furthermore, if the capacitor Cd alone can suppress the inrush current enough, the capacitor C0 can be omitted, thereby saving the circuit volume.

Note that FIGS. 2 and 3 shows an example where a distance between the second wire W2 and the third wire W3 is the same as a distance between the first wire W1 and the third wire W3. However, the third wire W3 can be formed closer to the second wire W2 with satisfying the design rule. By such a manner, the capacitor Cd can be set larger.

As stated above, in the first embodiment, the third wire W3 is formed integrally with the control signal line 4 above the gate of the transistors 2. Therefore, the capacitor Cd is formed between the control signal line 4 and the output power source line 3. Accordingly, the variation of the control signal PE becomes gentle, thereby suppressing the inrush current. Furthermore, since the third wire W3 is formed above the transistors 2, circuit volume can be saved.

Second Embodiment

In the first embodiment described above, the third wire W3 is provided on the first wiring layer on which the first and the second wires W1 and W2 are formed, to form the capacitor Cd between the control signal line 4 and the output power source line 3. On the other hand, in a second embodiment which will be described below, further wires are provided on a wiring layer above the first wiring layer, to enlarge the combined capacitor Ct.

Figure 5:
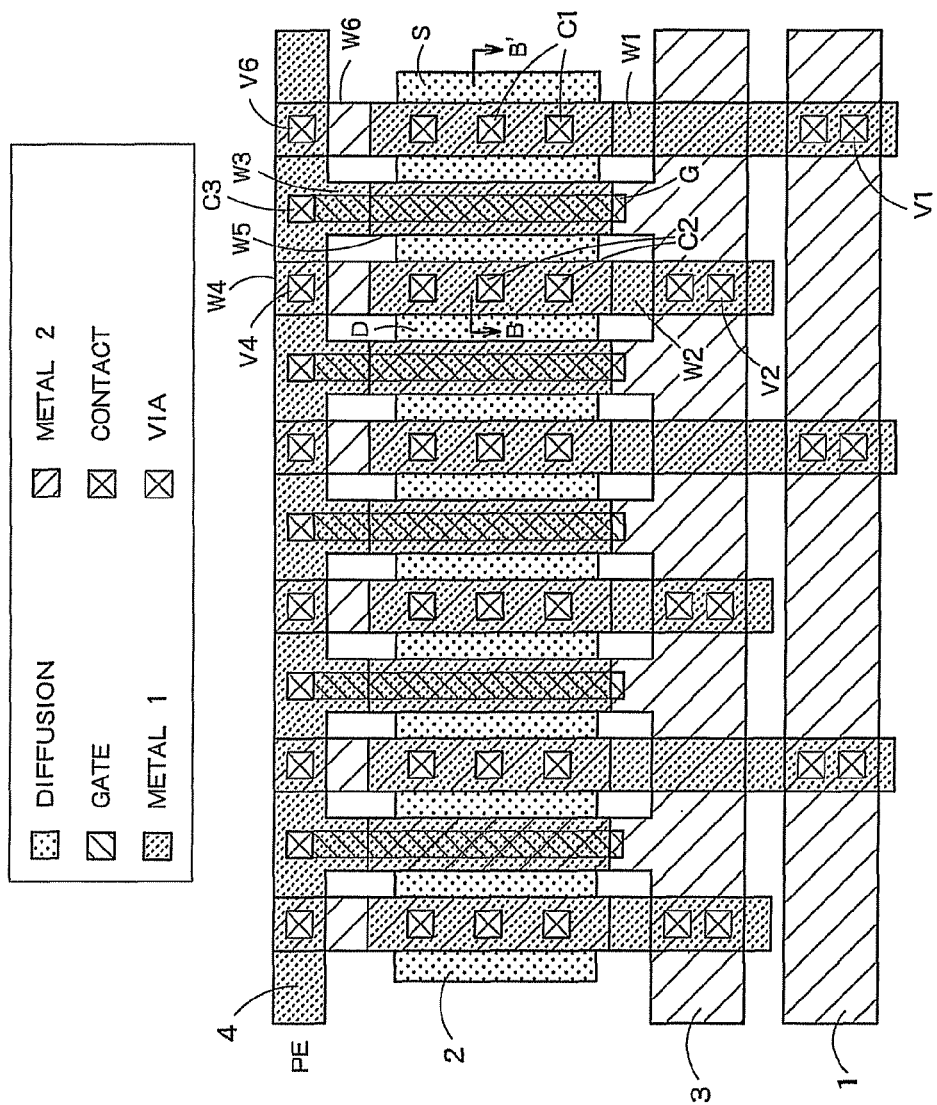
FIG. 5 is a diagram showing an example of a layout of the power source controller 201.

FIG. 5 is a diagram showing an example of a layout of the power source controller 201. FIG. 6 is a cross-section of BB' portion of FIG. 5. In FIGS. 5 and 6, components common to those of FIGS. 2 and 3 have common reference numerals, respectively. Hereinafter, components different from FIG. 1 will be mainly described below.

The power source controller 201 according to the present embodiment has fourth to sixth wires W4 to W6 in addition to the first to third wires W1 to W3. The fourth wire W4 is formed on the second wiring layer above the second wire W2, and is connected to the control signal line 4 through the via V4. The fifth wire W5 is formed above the third wire W3 integrated with the output power source line 3. The sixth wire W6 is formed on the second wiring layer above the first wire W1, and is connected to the control signal line 4 through the via V6.

As described above, the second and the fifth wires W2 and W5 are connected to the output power source line 3, while the third and the fourth wires W3 and W4 are connected to the control signal line 4. As a result, as shown in FIG. 6, a capacitor Cd1 is formed between the fourth wire W4 and the second wire W2, a capacitor Cd2 is formed between the fourth wire W4 and the fifth wire W5, a capacitor Cd3 is formed between the fifth wire W5 and the sixth wire W6, and a capacitor Cd4 is formed between the third wire W3 and the fifth wire W5, in addition to the capacitor Cd. Therefore, the combined capacitor can be Ct=C0+Cd+Cd1+Cd2+Cd3+Cd4, and thus, the combined capacitor can be further enlarged.

As stated above, in the second embodiment, the fourth to the sixth wires W4 to W6 are formed above the first to the third wires W1 to W3. Therefore, the combined capacitor Ct can be further increased, thereby suppressing the inrush current. Furthermore, it is possible to form the smaller capacitor C0.

Note that only the fourth wire W4 or the fifth wire W4 can be formed, and only the fifth and the sixth wires W5 and W6 can be formed in FIGS. 5 and 6. In these cases, the combined capacitor. Ct becomes larger than that of the first embodiment. Furthermore, it is also possible to form wires on wiring layers above the fourth to sixth wires W4 to W6 to increase the combined capacitor Ct.

Although examples are shown where the power source controller 200 (201) are provided between the supply voltage (reference supply voltage) and the internal circuit 150, the power source controller 200 (201) can be provided between the ground voltage (reference supply voltage) and the internal circuit 150. In this case, not the PMOS transistors 2 but NMOS transistors are used. However, basic operation principle is quite similar.

Furthermore, one or a plurality of wires (capacitor wires) can be formed so that capacitor is formed between the control signal line 4 and the output power source line 3, which can be different from the location shown in FIG. 2 or FIG. 5.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A power source controller comprising:
a first power source line supplied with a reference power source voltage;
a second power source line connected to an internal circuit;
a control circuit configured to control a connection between the first power source line and the second power source line;
a control signal line connected to the control circuit, and configured to provide a control signal for controlling the connection;
a transistor comprising a first terminal, a second terminal and a control terminal in the control circuit, the control terminal of the transistor being connected to the control signal line;
a semiconductor substrate on which the transistor is formed;
a first wire on a wire layer above the semiconductor substrate, and configured to connect the first terminal of the transistor with the first power source line;
a second wire on a wire layer above the semiconductor substrate, and configured to connect the second terminal of the transistor with the second power source line; and
a third wire on a wire layer above the semiconductor substrate, above the control terminal of the transistor, and formed integrally with the control signal line,
wherein the third wire and the second wire are substantially parallel with each other.

2. The controller of claim 1, wherein the second wire and the third wire are on an identical wire layer.

3. The controller of claim 1, wherein a distance between the second wire and the third wire is smaller than a distance between the first wire and the third wire.

4. The controller of claim 1 further comprising a fourth wire above the second wire, and connected to the control signal line.

5. The controller of claim 1 further comprising a fifth wire above the third wire, and formed integrally with the second power source line.

6. The controller of claim 5 further comprising a sixth wire above the first wire, and connected to the control signal line.

7. The controller of claim 1 further comprising a buffer configured to drive an input control signal to generate the control signal.

8. The controller of claim 1 further comprising a capacitor between the control signal line and the second power source line.

9. A semiconductor integrated circuit comprising:
an internal circuit; and
a power source controller configured to determine whether to supply a reference power source voltage to the internal circuit,
wherein the power source controller comprises:
a first power source line supplied with the reference power source voltage;
a second power source line connected to the internal circuit;
a control circuit configured to control a connection between the first power source line and the second power source line;
a control signal line connected to the control circuit, and configured to provide a control signal for controlling the connection;
a transistor comprising a first terminal, a second terminal and a control terminal in the control circuit, the control terminal of the transistor being connected to the control signal line;
a semiconductor substrate on which the transistor is formed;
a first wire on a wire layer above the semiconductor substrate, and configured to connect the first terminal of the transistor with the first power source line;
a second wire on a wire layer above the semiconductor substrate, and configured to connect the second terminal of the transistor with the second power source line; and
a third wire on a wire layer above the semiconductor substrate, above the control terminal of the transistor, and formed integrally with the control signal line,
wherein the third wire and the second wire are substantially parallel with each other.

10. The circuit of claim 9, wherein the second wire and the third wire are on an identical wire layer.

11. The circuit of claim 9, wherein a distance between the second wire and the third wire is smaller than a distance between the first wire and the third wire.

12. The circuit of claim 9 further comprising a fourth wire above the second wire, and connected to the control signal line.

13. The circuit of claim 9 further comprising a fifth wire above the third wire, and formed integrally with the second power source line.

14. The circuit of claim 13 further comprising a sixth wire above the first wire, and connected to the control signal line.

15. The circuit of claim 9 further comprising a buffer configured to drive an input control signal to generate the control signal.

16. The circuit of claim 9 further comprising a capacitor between the control signal line and the second power source line.

* * * * *